(12) United States Patent
Tsai et al.

(10) Patent No.: US 10,002,867 B2
(45) Date of Patent: Jun. 19, 2018

(54) FIN-TYPE FIELD EFFECT TRANSISTOR STRUCTURE AND MANUFACTURING METHOD THEREOF

(71) Applicant: Taiwan Semiconductor Manufacturing Co., Ltd., Hsinchu (TW)

(72) Inventors: Chun Hsiung Tsai, Hsinchu County (TW); Ziwei Fang, Hsinchu (TW); Tsan-Chun Wang, Hsinchu (TW); Kei-Wei Chen, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days. days.

(21) Appl. No.: 15/062,210

(22) Filed: Mar. 7, 2016

(65) Prior Publication Data

US 2017/0256539 A1  Sep. 7, 2017

(51) Int. Cl.
| H01L 27/088 | (2006.01) |
| H01L 29/06 | (2006.01) |
| H01L 29/08 | (2006.01) |
| H01L 21/8234 | (2006.01) |
| H01L 21/306 | (2006.01) |
| H01L 21/762 | (2006.01) |
| H01L 29/66 | (2006.01) |
| H01L 21/311 | (2006.01) |

(52) U.S. Cl.
CPC .... *H01L 27/0886* (2013.01); *H01L 21/30604* (2013.01); *H01L 21/31116* (2013.01); *H01L 21/76224* (2013.01); *H01L 21/823418* (2013.01); *H01L 21/823431* (2013.01); *H01L 21/823481* (2013.01); *H01L 29/0649* (2013.01); *H01L 29/0847* (2013.01); *H01L 29/6653* (2013.01)

(58) Field of Classification Search
CPC ..... H01L 21/823431; H01L 21/823821; H01L 21/845; H01L 27/0886; H01L 27/0924; H01L 27/10826; H01L 27/10879; H01L 27/1211; H01L 29/41791; H01L 29/66795; H01L 29/7831
USPC ........ 257/263, 288, 328, 368, 369; 438/137, 438/151, 156, 192, 197, 199
See application file for complete search history.

(56) References Cited

U.S. PATENT DOCUMENTS

| 2015/0214369 A1* | 7/2015 | Fronheiser | H01L 29/0847 257/192 |
| 2015/0372140 A1* | 12/2015 | Liu | H01L 29/7848 257/190 |
| 2016/0099342 A1* | 4/2016 | Basker | H01L 27/0924 438/283 |

(Continued)

*Primary Examiner* — Shahed Ahmed
(74) *Attorney, Agent, or Firm* — JCIPRNET

(57) ABSTRACT

A fin-type field effect transistor comprising a substrate, at least one gate stack and epitaxy material portions is described. The substrate has fins and insulators located between the fins, and the fins include channel portions and flank portions beside the channel portions. The at least one gate stack is disposed over the insulators and over the channel portions of the fins. The epitaxy material portions are disposed over the flank portions of the fins and at two opposite sides of the at least one gate stack. The epitaxy material portions disposed on the flank portions of the fins are separate from one another.

19 Claims, 12 Drawing Sheets

(56) References Cited

U.S. PATENT DOCUMENTS

2016/0189970 A1* 6/2016 Huang ................ H01L 21/3081
  438/703
2017/0005090 A1* 1/2017 Ando .................. H01L 27/0886

* cited by examiner

FIN-TYPE FIELD EFFECT TRANSISTOR STRUCTURE AND MANUFACTURING METHOD THEREOF

BACKGROUND

As the semiconductor devices keep scaling down in size, three-dimensional multi-gate structures, such as the fin-type field effect transistor (FinFET), have been developed to replace planar CMOS devices. A characteristic of the FinFET device lies in that the structure has one or more silicon-based fins that are wrapped around by the gate to define the channel of the device. The gate wrapping structure further provides better electrical control over the channel, thus reducing the current leakage and short-channel effects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
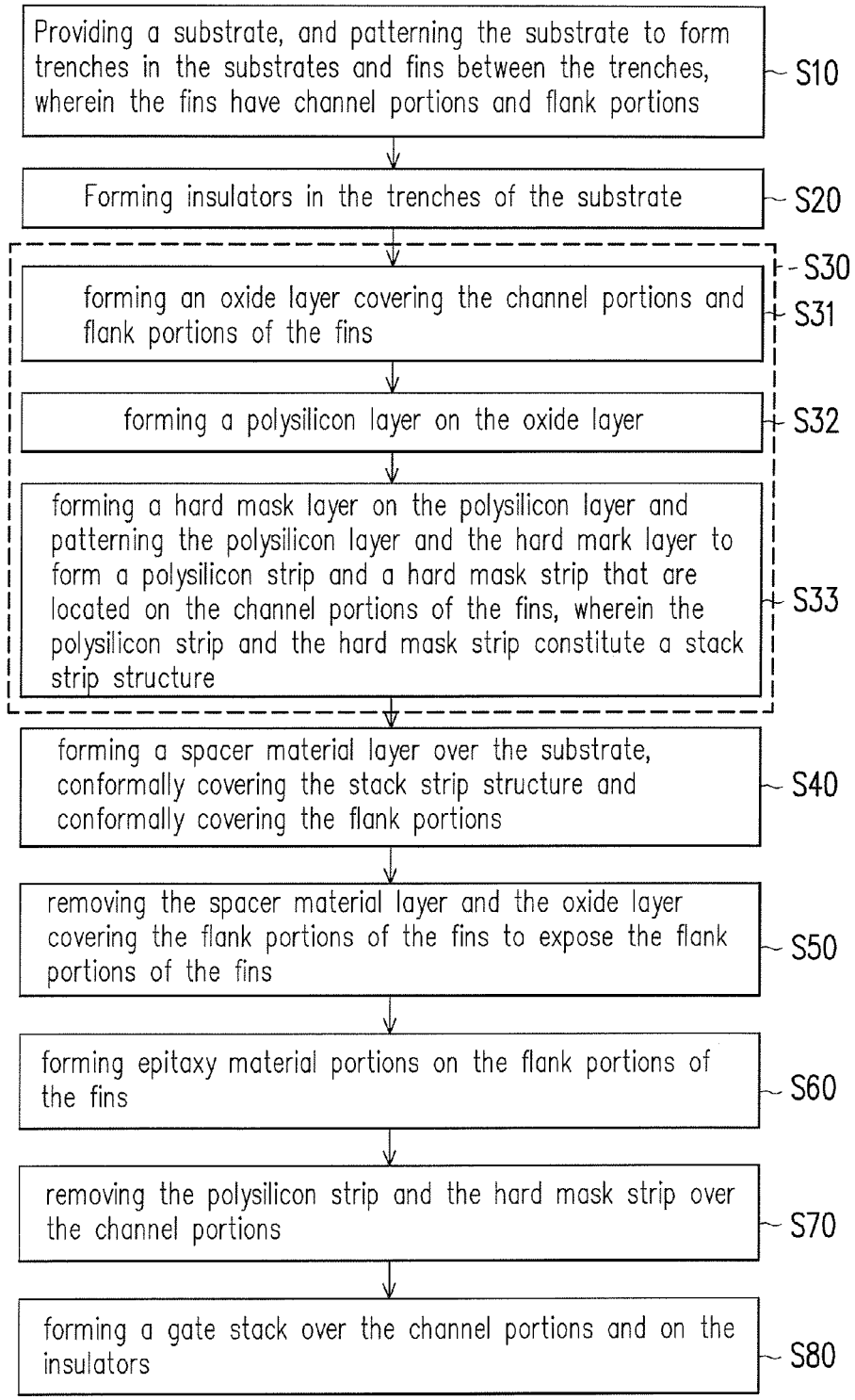
FIG. 1 is an exemplary flow chart showing the process steps of the manufacturing method for forming a FinFET in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary manufacturing processes of a three-dimensional structure with height differences and the structure(s) fabricated there-from. Certain embodiments of the present disclosure describe the exemplary manufacturing processes of FinFET devices and the FinFET devices fabricated therefrom. The FinFET device may be formed on a monocrystalline semiconductor substrate, such as a bulk silicon substrate in certain embodiments of the present disclosure. In some embodiments, the FinFET device may be foil red on a silicon-on-insulator (SOI) substrate or a GOI (germanium-on-insulator) substrate as alternatives. Also, in accordance with the embodiments, the silicon substrate may include other conductive layers, doped regions or other semiconductor elements, such as transistors, diodes or the like. The embodiments are intended to provide further explanations but are not used to limit the scope of the present disclosure.

In accordance with the embodiments, FIG. 1 is an exemplary flow chart showing the process steps of the manufacturing method for forming a FinFET. The various process steps of the process flow illustrated in FIG. 1 may comprise multiple process steps as discussed below. FIGS. 2A-2G are the perspective views and cross-sectional views showing the FinFET at various stages of the manufacturing method for forming the FinFET 10 according to some embodiments of the present disclosure. It is to be noted that the process steps described herein cover a portion of the manufacturing processes used to fabricate a FinFET device.

Figure 2A:
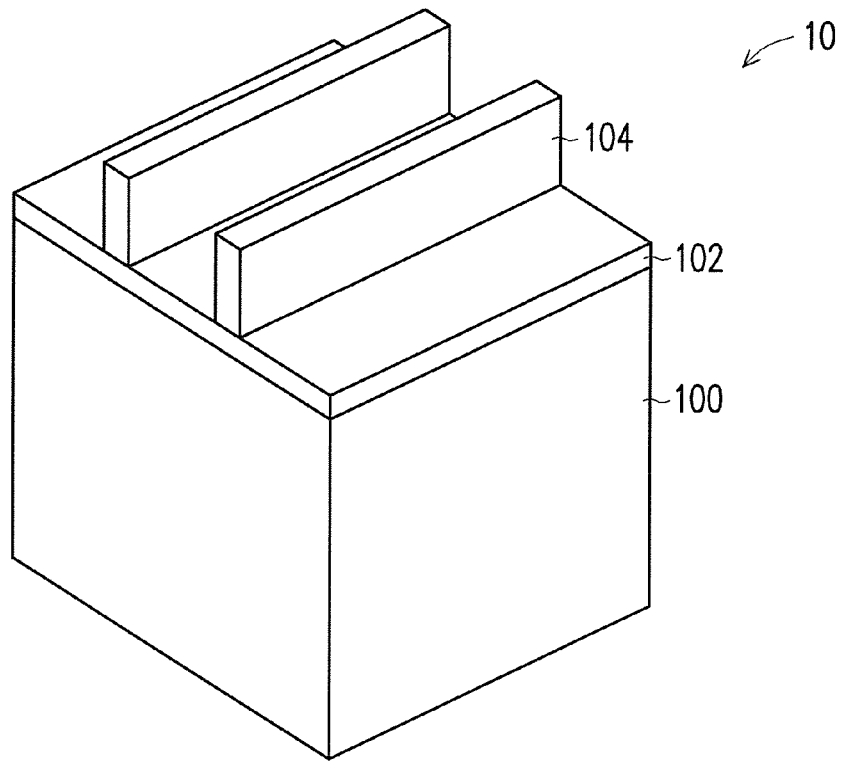
FIGS. 2A-2G are the perspective views and cross-sectional views showing the FinFET at various stages of the manufacturing method for forming a FinFET according to some embodiments of the present disclosure.

FIG. 2A is a perspective view of the FinFET 10 at one of various stages of the manufacturing method. In Step S10 in FIG. 1 and as shown in FIG. 2A, a substrate 100 is provided. In one embodiment, the substrate 100 comprises a crystalline silicon substrate (e.g., wafer). The substrate 100 may comprise various doped regions depending on design requirements (e.g., p-type substrate or n-type substrate). In some embodiments, the doped regions are doped with p-type and/or n-type dopants. For example, the p-type dopants are boron or $BF_2$ and the n-type dopants are phosphorus or arsenic. The doped regions may be configured for an n-type FinFET or a p-type FinFET. In some alternative embodiments, the substrate 100 is made of other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In one embodiment, a mask layer 102 and a photo-sensitive pattern 104 are sequentially formed on the substrate 100. In at least one embodiment, the mask layer 102 is a silicon nitride layer formed, for example, by low-pressure chemical vapor deposition (LPCVD) or plasma enhanced chemical vapor deposition (PECVD). The mask layer 102 is used as a hard mask during subsequent photolithography processes. Then, a photo-sensitive pattern 104 having a predetermined pattern is formed on the mask layer 102.

Figure 2B:
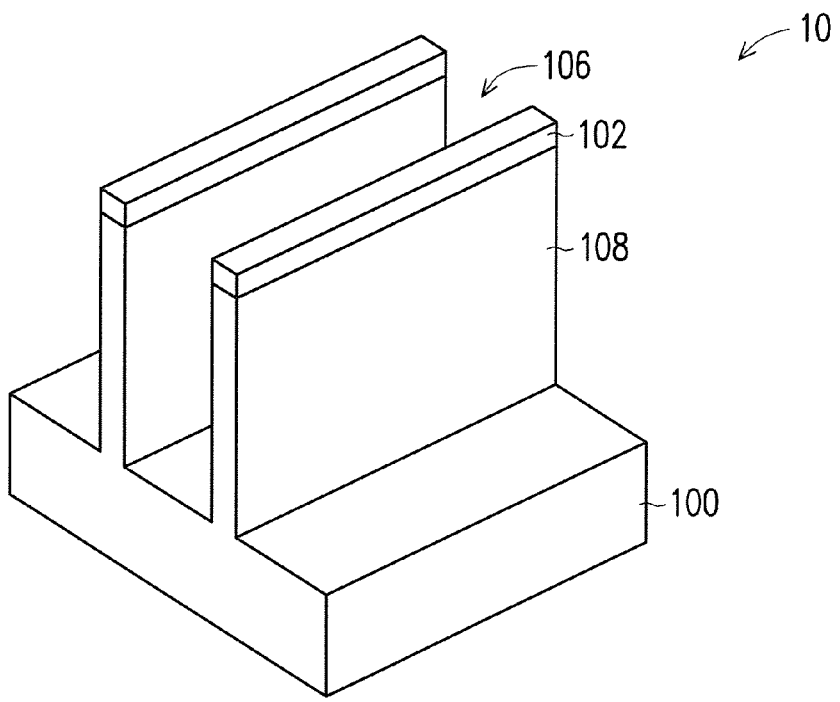

FIG. 2B is a perspective view of the FinFET 10 at one of various stages of the manufacturing method. In Step S10 in FIG. 1 and as shown in FIGS. 2A-2B, the substrate 100 is patterned to form trenches 106 in the substrate 100 and fins 108 are formed between the trenches 106 by etching into the substrate 100, using the photo-sensitive pattern 104 and the mask layer 102 as etching masks. In one embodiment, a fin pitch between the fins 108 is less than 30 nm, but is not particularly limited thereto. The number of the fins 108 shown in FIG. 2B is merely for illustration, in some alternative embodiments, two or more parallel semiconductor fins may be formed in accordance with actual design requirements. After the trenches 106 and the fins 108 are foil led, the photo-sensitive pattern 104 is then removed from the surface of the patterned mask layer 102. In one embodiment, an optional cleaning process may be performed to remove a native oxide of the substrate 100 and the fins 108. The cleaning process may be performed using diluted hydrofluoric (DHF) acid or other suitable cleaning solutions.

Figure 2C:
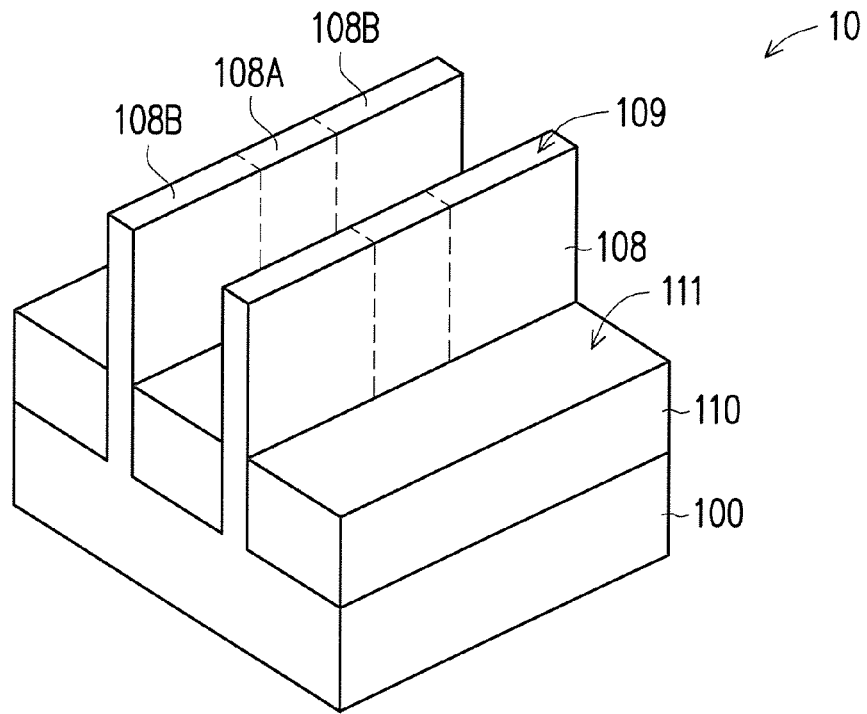

FIG. 2C is a perspective view of the FinFET 10 at one of various stages of the manufacturing method. In step S20 in FIG. 1 and as shown in FIG. 2C, insulators 110 are disposed on the substrate 100 and within the trenches 106 of the substrate 100. The insulators 110 are disposed between the fins 108. In an embodiment, portions of the fins 108 are protruded from the top surfaces 111 of the insulators 110. That is, the top surfaces 111 of the insulators 110 located within the trenches 106 are lower than the top surfaces 109 of the fins 108. In one embodiment, the protruded portions of the fins 108 include channel portions 108A and flank portions 108B beside the channel portions 108A. Furthermore, in certain embodiments, the flank portions 108B of the fins 108 are of substantially the same height as that of the channel portions 108A of the fins 108. In some embodiments, the material of the insulators 110 includes silicon oxide, silicon nitride, silicon oxynitride, a spin-on dielectric material, or a low-k dielectric material. In one embodiment, the insulators 110 are formed by high-density-plasma chemical vapor deposition (HDP-CVD), sub-atmospheric chemical vapor deposition (SACVD) or by spin-on.

After the insulators 110 shown in FIG. 2C are formed, the step S30 illustrated in FIG. 1 are performed for forming a stack strip structure. Detailed descriptions of the step S30 are discussed in accompany with FIGS. 2D to 2E.

Figure 2D:
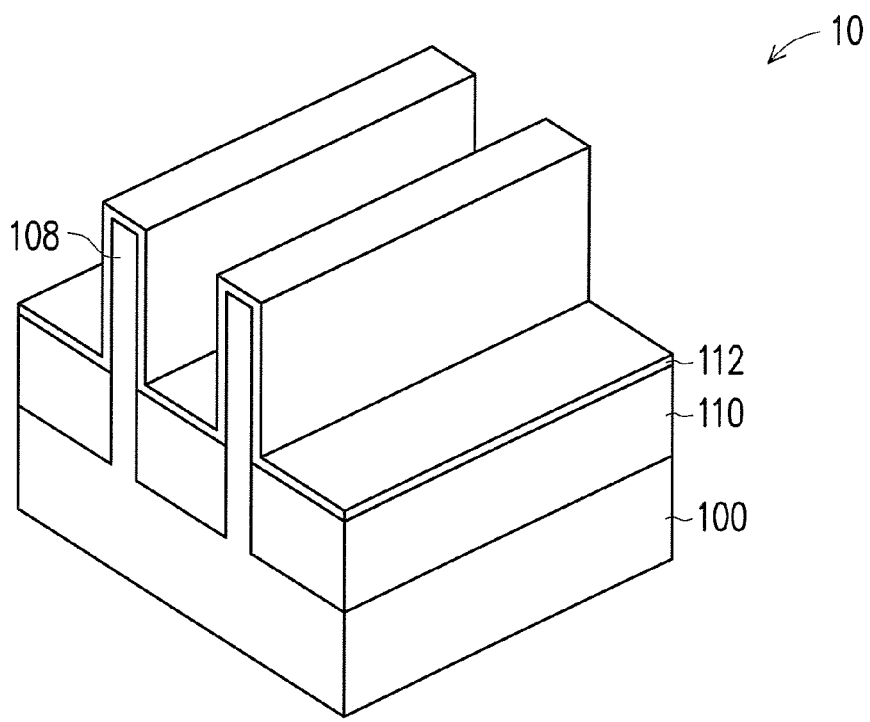
Figure 2E:
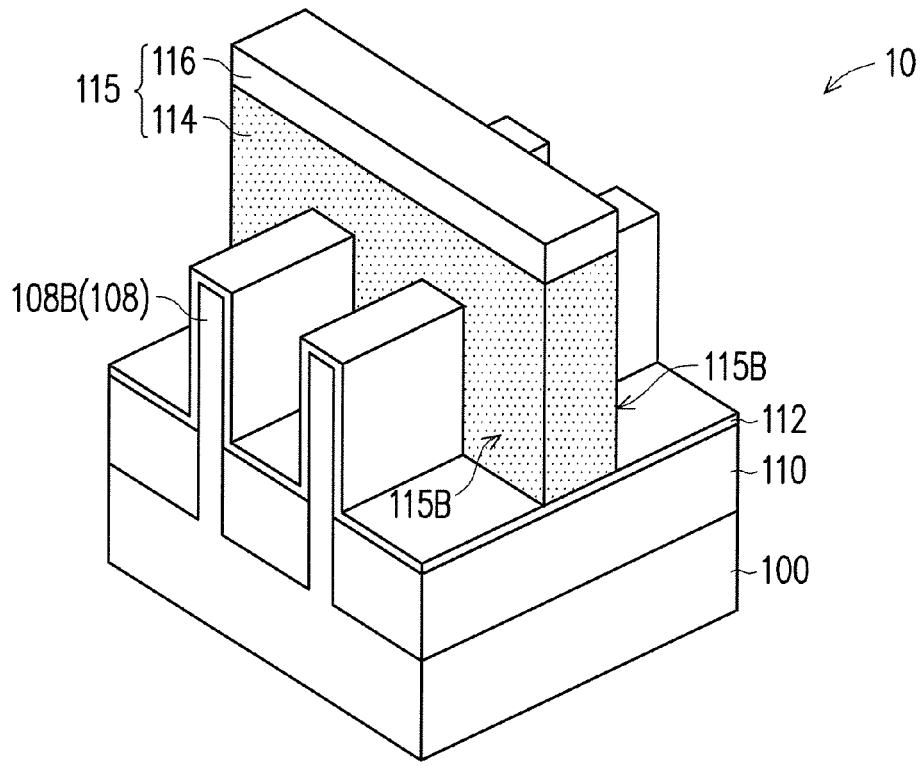

FIG. 2D and FIG. 2E are perspective views of the FinFET 10 at one of various stages of the manufacturing method. As illustrated in FIG. 1, the step S30 for forming a stack strip structure may further include the step S31, step S32 and step S33. In some embodiments, as shown in FIG. 2D and in step S31, an oxide layer 112 is optionally formed over the substrate 100 and covering the channel portions 108A and the flank portions 108B (as labelled in FIG. 2C) of the fins 108. Next, in step S32 of FIG. 1, a polysilicon layer (not shown) is formed on the oxide layer 112, and in step S33 of FIG. 1, a hard mask layer (not shown) is formed on the polysilicon layer. As shown in FIG. 2E, the polysilicon layer and the hard mask layer are patterned to form a polysilicon strip 114 and a hard mask strip 116. Herein, the polysilicon strip 114 and the hard mask strip 116 are referred as a stack strip structure 115 having sidewalls 115B. The number of the stack strip structure 115 is not limited to one but may be more than one. In some embodiments, the extension direction of the stack strip structure 115 (the polysilicon strip 114 and the hard mask strip 116) is arranged to be perpendicular to the extension direction of the fins 108, and the stack strip structure 115 is arranged across the fins 108 and covers the channel portions 108A of the fins 108. In one embodiment, the material of the hard mask strip 116 includes silicon nitride, silicon oxide or the combination thereof.

Figure 2F:
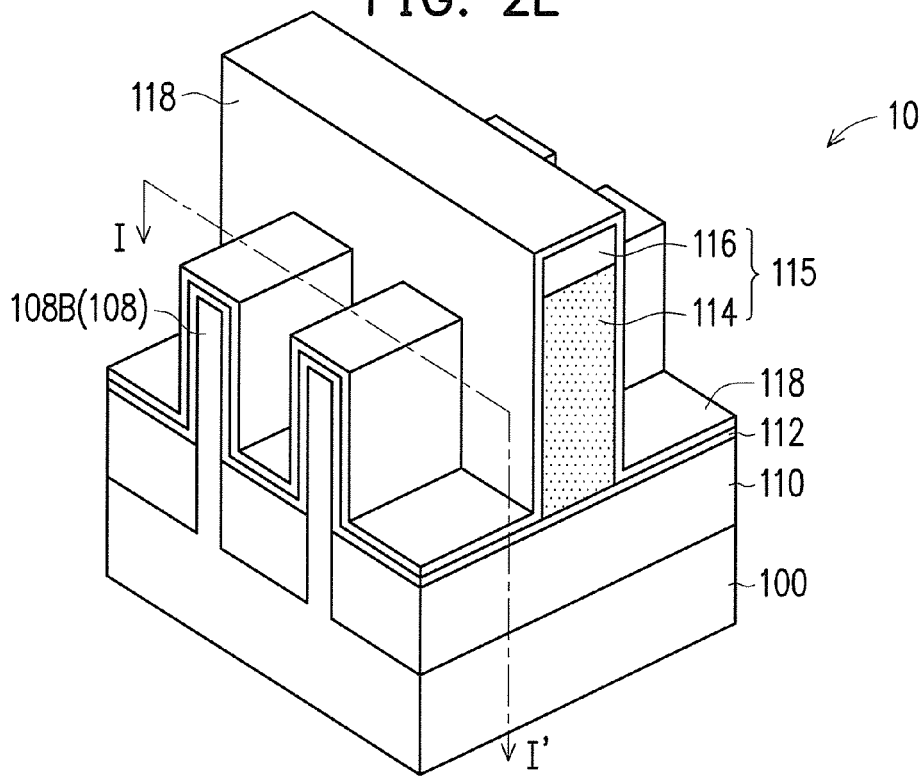
Figure 2G:
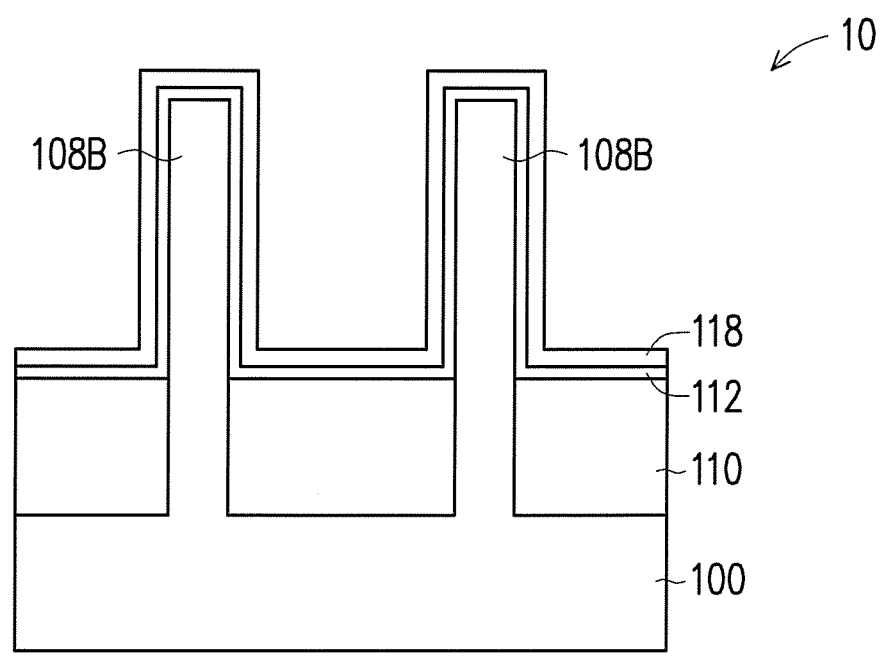

FIG. 2F is a perspective view of the FinFET 10 at one of various stages of the manufacturing method. FIG. 2G is a cross-sectional view of the FinFET taken along the line I-I' of FIG. 2F. As shown in step S40 of FIG. 1 and in FIGS. 2F and 2G, a spacer material layer 118 is formed over the substrate 100, conformally covering the stack strip structure 115 and conformally covering the flank portions 108B of the fins 108. In some embodiments, the spacer material layer 118 is formed of one or more dielectric materials, such as silicon nitride, silicon carbon oxynitride (SiCON), silicon carbonitride (SiCN) or combinations thereof. The spacer material layer 118 may be a single layer or a multilayered structure. In some embodiments, the spacer material layer 118 is formed by depositing a blanket layer of one or more dielectric materials. In one embodiment, the spacer material layer 118 has a thickness ranging from 3 nm to 10 nm.

Figure 3A:
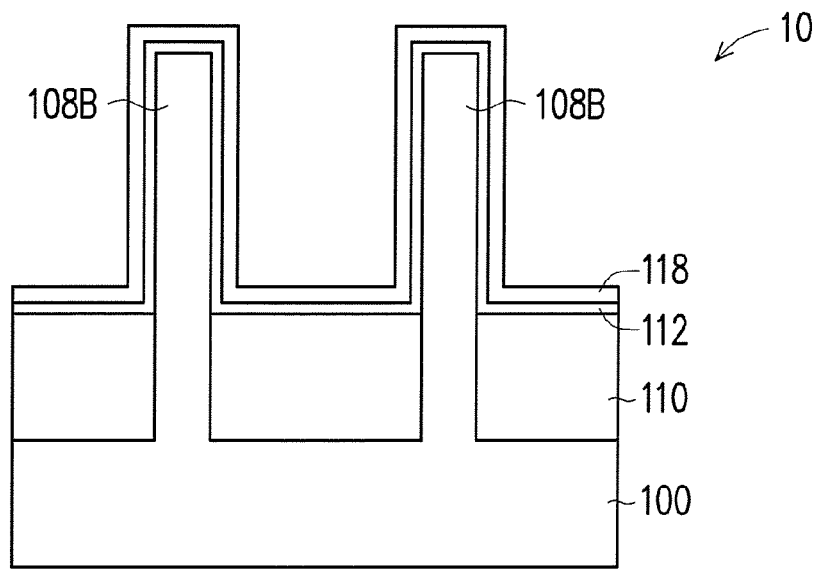
FIGS. 3A-3H are cross-sectional views showing a portion of the FinFET fabricated with the atomic layer etching process according to some embodiments of the present disclosure.
Figure 3B:
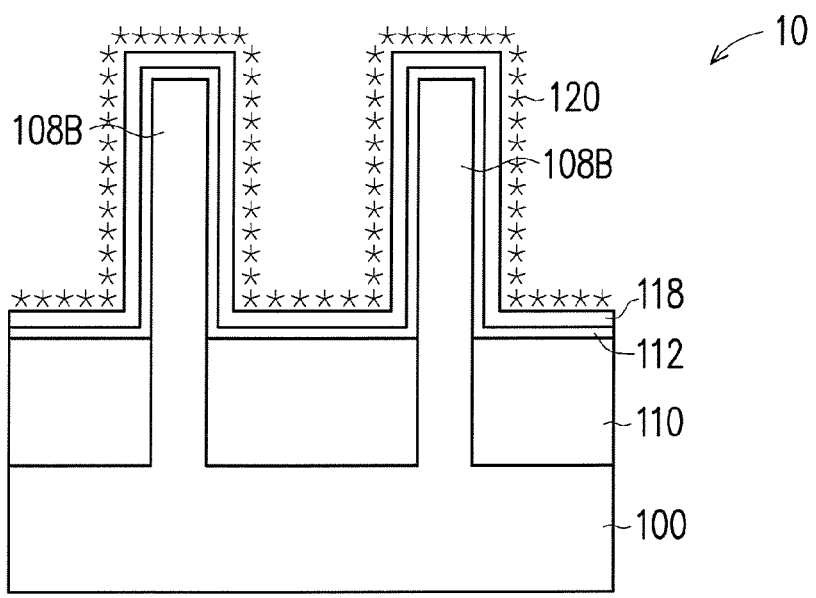
Figure 3C:
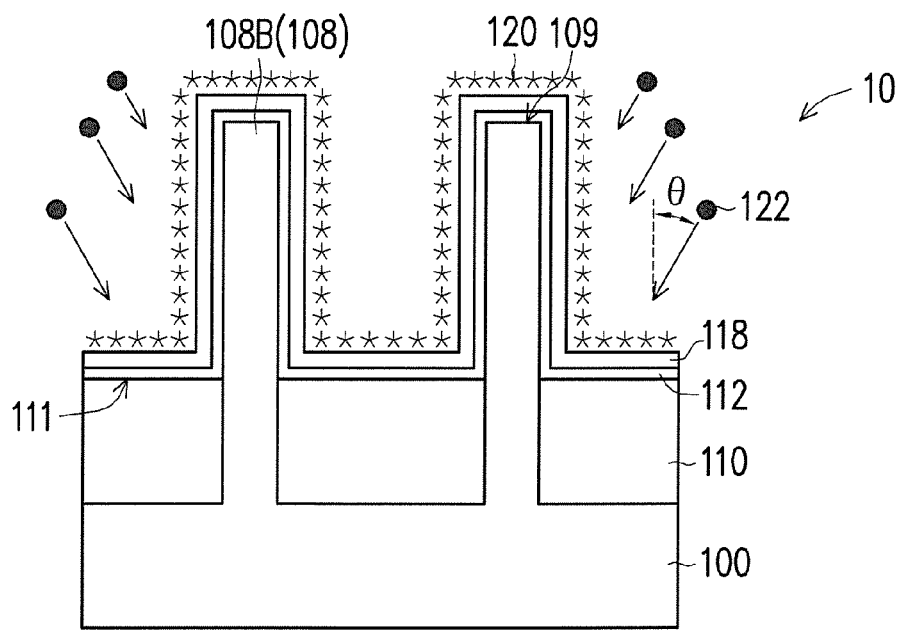

FIGS. 3A-3H are cross-sectional views showing a portion of the FinFET 10 fabricated with the atomic layer etching process according to some embodiments of the present disclosure. In step S50, and as shown in FIG. 3A to 3H, the spacer material layer 118 and the oxide layer 112 covering the flank portions 108B of the fins 108 are removed via performing an atomic layer etching (ALE) process. Also, the spacers are formed on sidewalls of the stack strip structure 115 (in FIG. 4A). The ALE process is an angled ALE process and comprises at least performing an angled ion bombardment process to selectively remove the material(s) located on the sidewalls of the fins 108. FIG. 3A is a cross-sectional view of the flank portions of the FinFET 10 prior to performing the atomic layer etching process. FIG. 3A shows that the flank portions 108B of the fins 108 have the oxide layer 112 and the spacer material layer 118 covered thereon. As shown in FIG. 3B, the atomic layer etching process comprises depositing a conformal layer of an etchant 120 on the spacer material layer 118. In one embodiment, the layer thickness of the etchant 120 is adjusted with the etching rate. In another embodiment, the etching rate of the etchant 120 is approximately 0.5 nm/cycle to 3 nm/cycle. Next, as shown in FIG. 3C, an angled ion bombardment process is performed to the spacer material layer 118. In one embodiment, the angled ion bombardment process is performed by using inert gas ion beam 122 so as to allow the etchant 120 to react with the dielectric material of the spacer material layer 118. In certain embodiments, the inert gas used in the inert gas ion beam 122 is selected from He, Ar, Ne, Kr or Xe. Furthermore, in one embodiment, the angled ion bombardment process is performed at an ion energy of 0.2 keV to 1 keV. In another embodiment, the angled ion bombardment process is performed with a dose ranging from $7*10^{13}/cm^2$ to $5*10^{15}/cm^2$. In some embodiments, the angled ion bombardment process is performed at an angle θ, and the angle θ is in the range of 0-45 degrees, or 5-30 degrees. The angle θ is an angle measured from a vertical direction (shown as the dot line in FIG. 3C), whereas the vertical direction is the direction perpendicular to the top surface 109 of the fin 108 or perpendicular to the top surface 111 of the insulator 110. As the stack strip structure is generally arranged substantially perpendicular to the fins 108, the angled ion bombardment process performed toward the sidewalls 107 of the fins 108 is parallel to the sides of the stack strip structure. Thus the sidewalls 107 of the fins 108 are treated by the angled ion bombardment process with a suitable angle θ, while no substantial damage is caused to the sidewalls 115B of the stack strip structure 115. Based on the above, a suitable ion energy, dose and etchants are chosen for suitable etching selectivity based on the material(s) of the spacer material layer, while a suitable angle for performing the angled ion bombardment process is selected based on the fin pitch and/or the fin height of the fins.

Figure 3D:
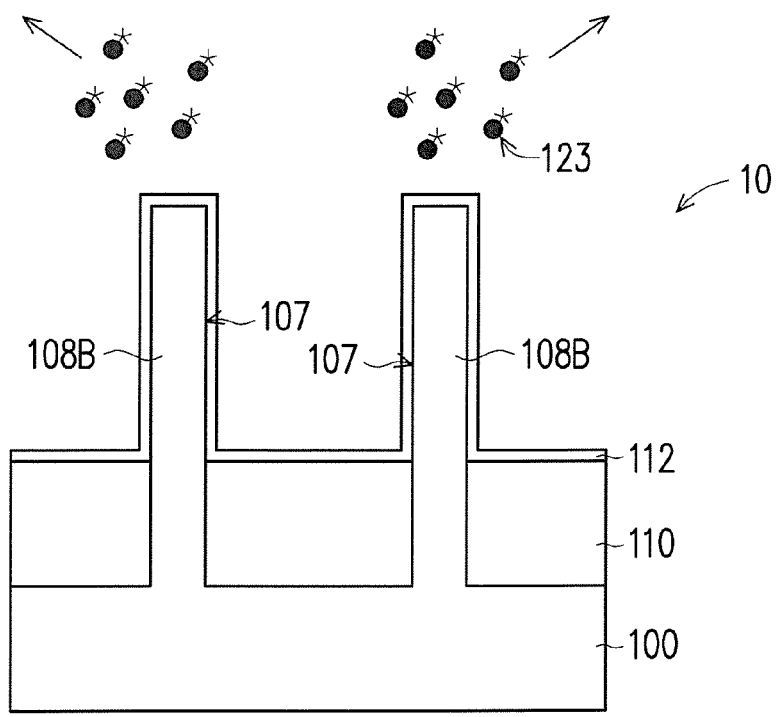

Next, as shown in FIG. 3D, the spacer material layer 118 over the flank portions 108B of the fins 108 are removed by stripping off the reacted products 123. The reacted products 123 are the products of the dielectric material of the spacer material layer 118 reacted with the etchant 120 and are removed during the purge of the etchant 120. In certain embodiments, the steps performed in FIG. 3B, 3C and FIG. 3D are repeated until the spacer material layer 118 on and over the flank portions 108B of the fins 108 are removed. In one embodiment, the flank portions 108B and the channel portions 108A of the fins 108 have substantially a same height after removing the spacer material layer 118 on the flank portions 108B of the fins 108. In one embodiment, the atomic layer etching process may strip off the dielectric material of the spacer material layer 118 by mono-layers or several-layers of the dielectric layer. Through the atomic layer etching process comprising performing an angled ion bombardment process, the spacer material layer 118 located on the sidewalls 107 of the fins 108 (the flank portions 108B) is removed without consuming the fins 108 of a small fin pitch.

After removing the spacer material layer 118 over the flank portions 108B of the fins 108, a layer of another etchant 124 is deposited onto the oxide layer 112. Similar to the embodiment shown in FIG. 3C, an angled ion bombardment process is performed in FIG. 3F by using the inert gas ion beam 122 so as to allow the etchant 124 to react with the oxide material of the oxide layer 112. In certain embodiments, the inert gas used in the inert gas ion beam 122 is selected from He, Ar, Ne, Kr or Xe. Furthermore, in one embodiment, the angled ion bombardment process is performed at an ion energy of 0.2 keV to 1 keV. In another embodiment, the angled ion bombardment process is performed with a dose ranging from $7*10^{13}/cm^2$ to $5*10^{15}/cm^2$. In another embodiment, the angled ion bombardment process is performed at an angle θ, and the angle θ is in the range of 0-45 degrees, or 5-30 degrees.

Figure 3E:
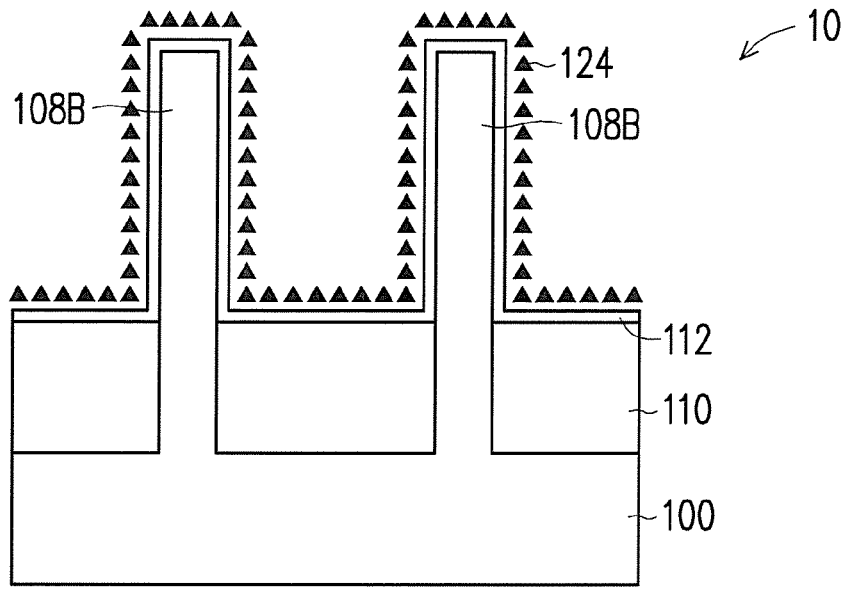
Figure 3F:
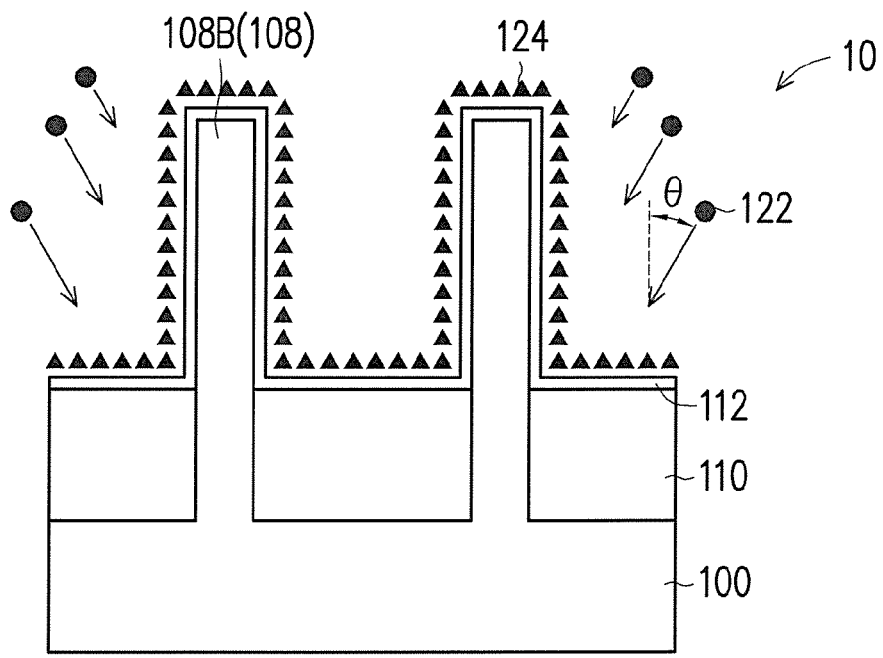
Figure 3G:
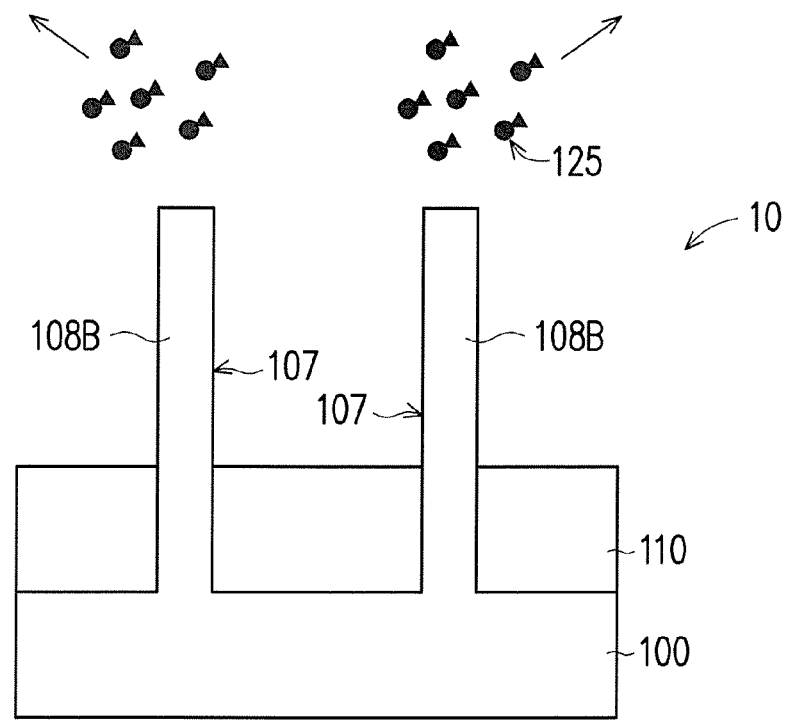

Next, as shown in FIG. 3G, the oxide layer 112 over the flank portions 108B of the fins 108 is removed by stripping off the reacted products 125. The reacted products 125 are the products of the oxide material of the oxide layer 112 reacted with the etchant 124, and are removed during the purge of the etchant 124. In certain embodiments, the steps performed in FIG. 3E, 3F and FIG. 3G are repeated until the oxide layer 112 over the flank portions 108B of the fins 108 is removed. Similarly, in one embodiment, the atomic layer etching process may strip off the oxide of the oxide layer 112 by mono-layers or several-layers. Through the atomic layer etching process comprising performing an angled ion bombardment process, the oxide layer 112 located on the sidewalls 107 of the fins 108 is removed. The angle θ of the inert gas ion beam 122 used in the angled ion bombardment process may be adjusted according to the fin pitch and/or fin height of the fins 108. In one embodiment, different etchants 120 and 124 may be used for removing different materials of the spacer material layer 118 and/or the oxide layer 112. In certain embodiments, the etching rate of the etchant 124 is approximately 0.5 nm/cycle to 3 nm/cycle.

Figure 3H:
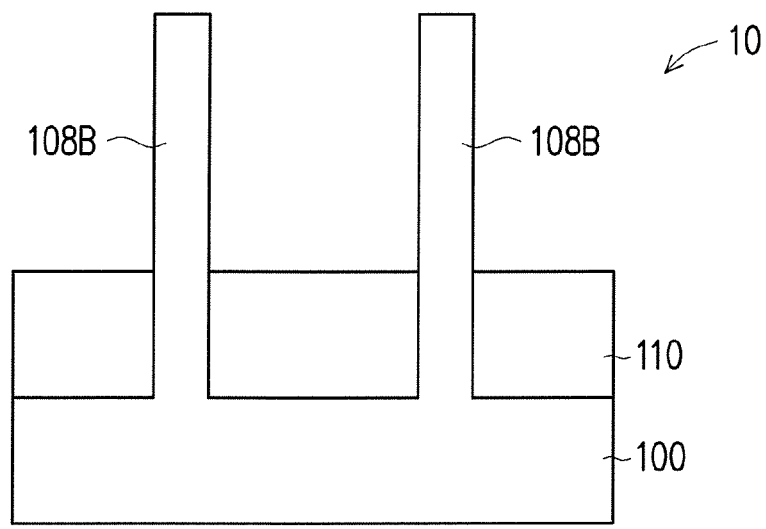
Figure 4A:
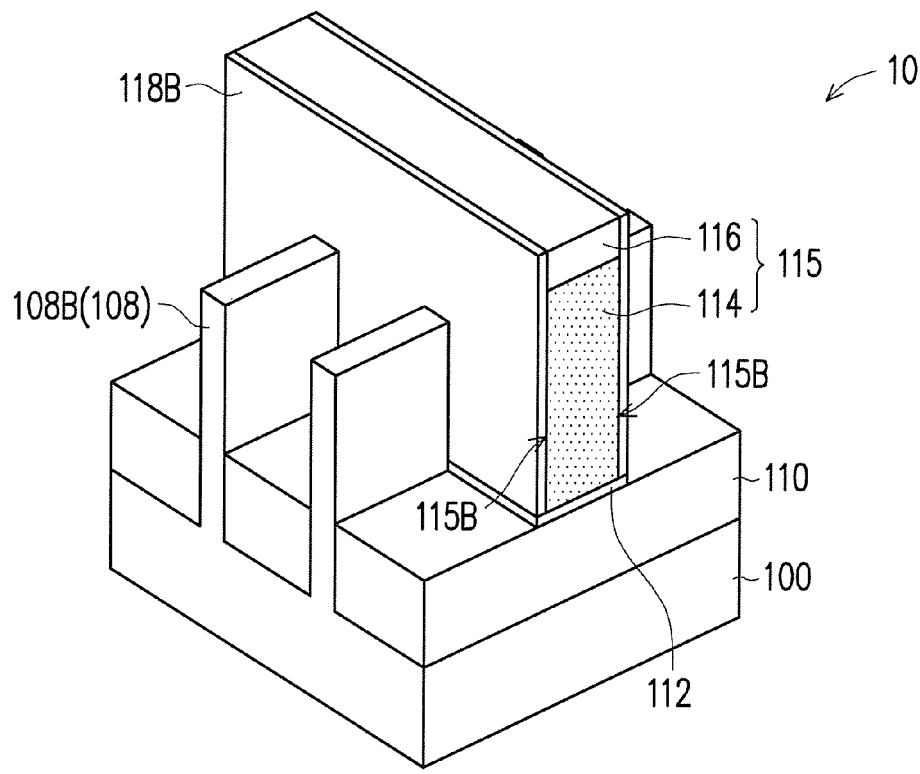
FIGS. 4A-4E are the perspective views and cross-sectional views showing the FinFET at various stages of the manufacturing method for forming a FinFET according to some embodiments of the present disclosure.

After purging off the reacted products 125 in FIG. 3G, as shown in FIG. 3H, the flank portions 108B of the fins 108 are exposed as both of the spacer material layer 118 and the oxide layer 112 covering the flank portions 108B of the fins 108 are removed. In some embodiments, through the angled ALE process, the spacer material layer 118 over the flank portions 108B of the fins 108 is removed, and the spacer material layer 118 on the sidewalls 115B of the stack strip structure 115 remains to become gate spacers 118B (FIG. 4A). In another embodiment, the etching selectivity of the angled ALE process is designed to get minimum damage (less than 1 nm) or loss to the gate spacers and fins. Furthermore, in an embodiment, if the spacer material layer 118 is a multilayered structure, then different etchants may be used accordingly to etch off multiple layers of the spacer material layer 118. Alternatively, the angled ALE process of the manufacturing method described in the above embodiments is suitable for any three-dimensional structure with relatively large height difference(s) and small spacing (such as the fin structures in the FinFET), as the angled ALE process leads to satisfactory removal of the material from the sidewalls of the structure.

FIGS. 4A-4E are the perspective views and cross-sectional views showing the FinFET 10 at various stages of the manufacturing method for forming a FinFET according to some embodiments of the present disclosure. In an embodiment shown in FIG. 4A, after the atomic layer etching process, the flank portion 108B of the fins 108 are exposed and gate spacers 118B located on the sidewalls 115B of the stack strip structure 115 are formed. That is, the spacer material layer 118 on the flank portions 108B of the fins 108 is etched off but the spacer material layer 118 located on the sidewalls 115B of the stack strip structure 115 is remained. In certain embodiments, the angled atomic layer etching process substantially removes the spacer material layer 118 on the sidewalls 107 of the flank portions 108B of the fins 108 without substantially removing the spacer material layer 118 on the sidewalls 115B of the at least one stack strip structure 115. The oxide layer 112 also remains below the polysilicon strip 114 and on the channel portion 108A of the fins 108.

Figure 4B:
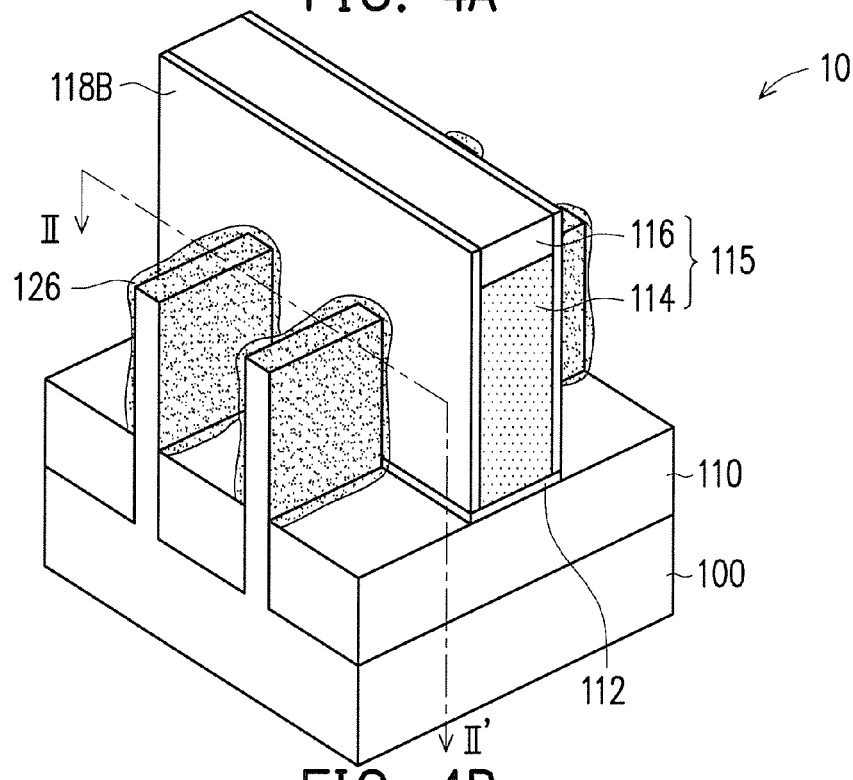
Figure 4C:
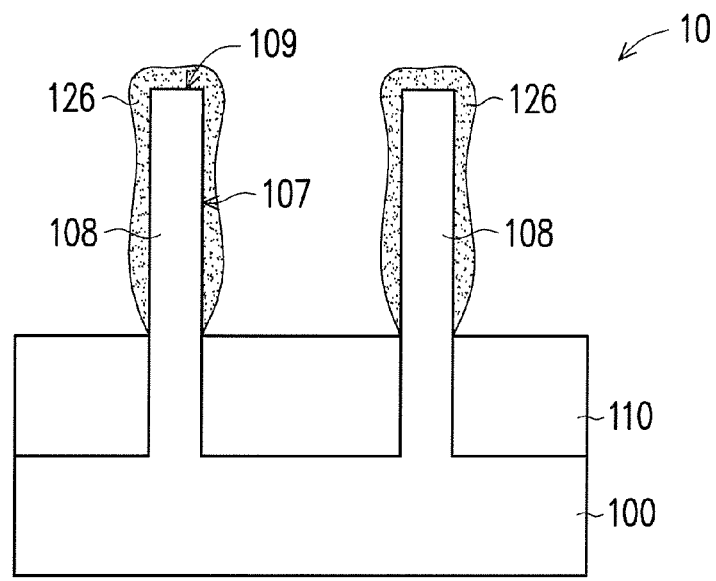

FIG. 4B is a perspective view of the FinFET at one of various stages of the manufacturing method. FIG. 4C is a cross-sectional view of the FinFET taken along the line II-IF of FIG. 4B. As in step S60 of FIG. 1 and in FIGS. 4B and 4C, epitaxy material portions 126 are formed over and cover the flank portions 108B of the fins 108. In one embodiment, as shown in FIG. 4C, the epitaxy material portions 126 formed over the flank portions 108B of one fin 108 are separate from the epitaxy material portions 126 formed over the flank portions 108B of another adjacent fin 108. That is, the epitaxy material portions 126 disposed on different fins 108 do not contact each other, hence, having a narrow profile. In another embodiment, the epitaxy material portions 126 conformally cover the sidewalls 107 and top surfaces 109 of the flank portions 108B of the fins 108. Additionally, the epitaxy material portions 126 disposed on the flank portions 108B are located on two opposite sides of the stack strip structure 115. In some embodiments, the epitaxy material portions 126 comprise strained materials such as SiGe, silicon carbon (SiC) or SiP, for example. In some embodiments, the epitaxy material portions 126 are formed on the flank portion 108B of the fins 108 by performing an epitaxy cladding process. In an embodiment, the epitaxy cladding process is used to grow the epitaxy material portions 126 on the fins 108 by using gaseous or liquid precursors. In one embodiment, the epitaxy cladding process includes a liquid phase epitaxy process, a hydride vapor phase epitaxy process, a molecular beam epitaxy process, a metal organic vapor phase epitaxy (MOVPE) process, or the like. In one embodiment, the epitaxy cladding process includes a selective epitaxy growth process. In another embodiment, in-situ doping is performed during the epitaxy cladding process. In some embodiments, the epitaxy cladding process generates an over-layer with a random orientation or does not form an ordered over-layer on the flank portions 108B of the fins 108. Since the material of the epitaxy material portions 126 has the lattice constant different from that of the material of the substrate 100, the channel region is strained or stressed to increase carrier mobility of the device and enhance the device performance. In some embodiments, the flank portions 108B of the fins 108 (a portion of the fins 108) and the epitaxy material portions 126 disposed on top of the flank portions 108B are implanted to form source and drain regions. The source and drain regions, also called strained source and drain regions, are located at two opposite sides of the stack strip structure 115. In some embodiments, the source and drain regions are optionally Ruined with silicide top layers (not shown) by silicidation.

Figure 4D:
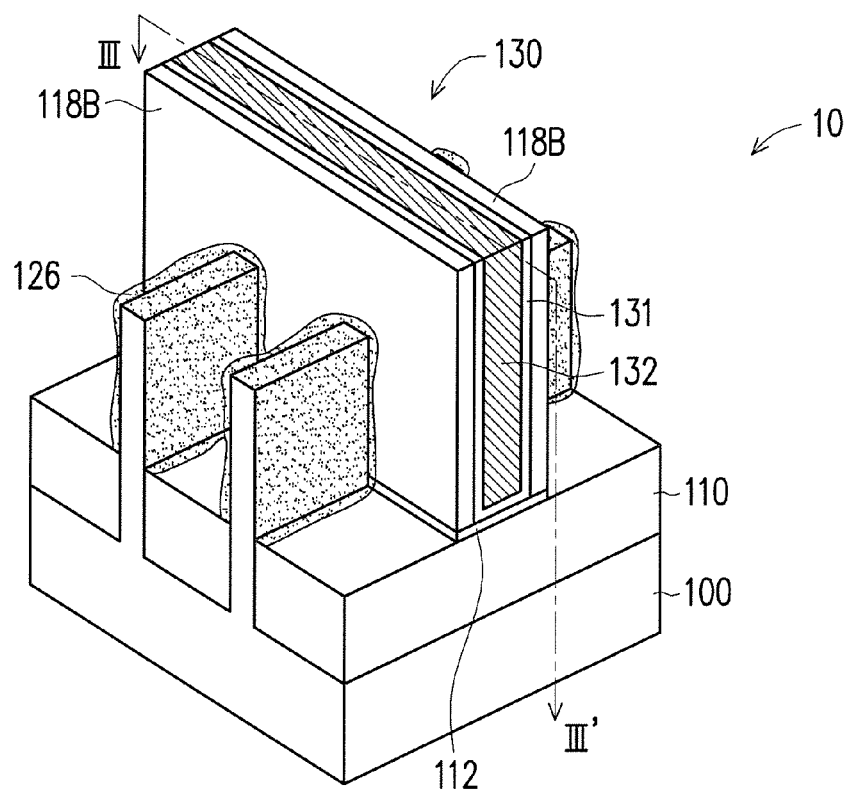
Figure 4E:
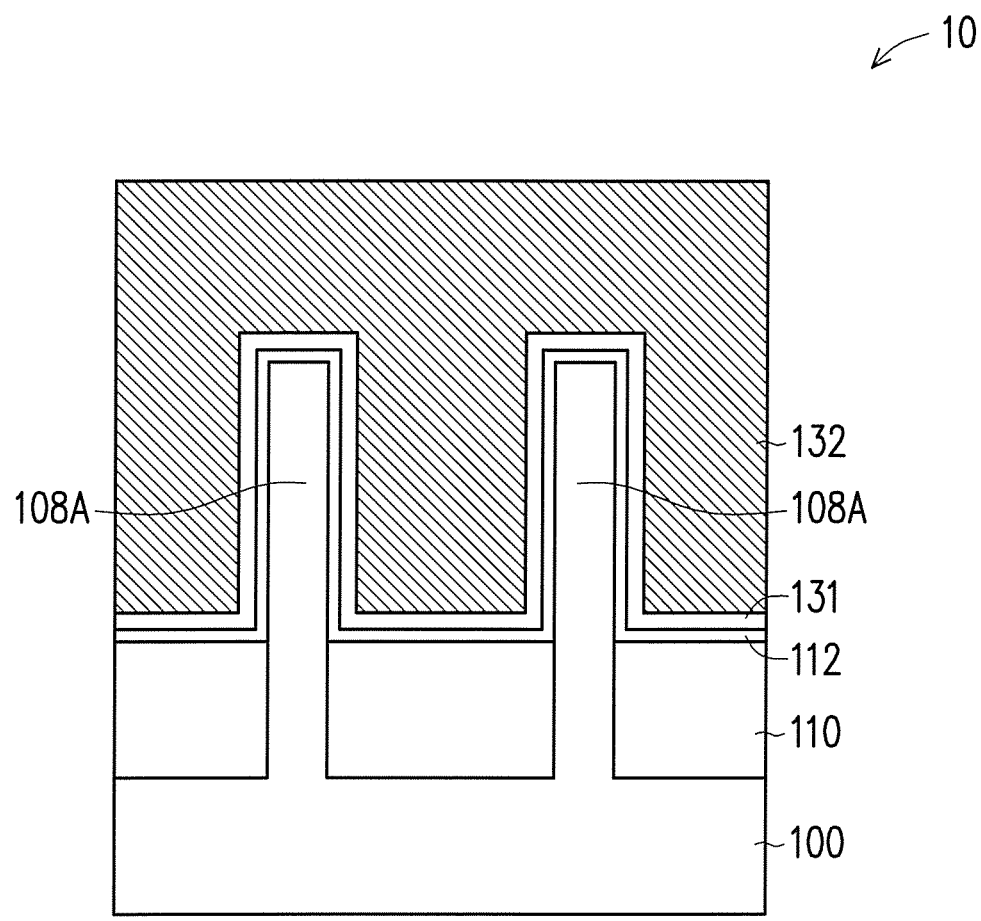

FIG. 4D is a perspective view of the FinFET at one of various stages of the manufacturing method. FIG. 4E is a cross-sectional view of the FinFET taken along the line of FIG. 4D. In an embodiment shown in step S70 of FIG. 1, the polysilicon strip 114 and the hard mask strip 116 located on the channel portions 108A of the fins 108 are removed. In one embodiment, the polysilicon strips 114 and the hard mask strips 116 on the polysilicon strips 114 are removed by anisotropic etching and the gate spacers 118B and the oxide layer 112 are remained. Then in step S80 of FIG. 1 and in FIG. 4D and FIG. 4E, a gate stack 130 is formed over the channel portions 108A of the fins 108, and over the substrate 100 and on the insulators 110. The gate stack 130 comprises a gate dielectric layer 131, a gate electrode layer 132 and the gate spacers 118B. In an embodiment, the gate dielectric layer 131 is formed within the recesses between the gate spacers 118B and on the oxide layer 112, and over the channel portions 108A of the fins 108. In some embodiments, the material of the gate dielectric layer 131 comprises silicon oxide, silicon nitride or the combination thereof. In some embodiments, the gate dielectric layer 131 comprises a high-k dielectric material, and the high-k dielectric material has a k value greater than about 7.0 and includes a metal oxide or a silicate of Hf, Al, Zr, La, Mg, Ba, Ti, Pb and combinations thereof. In some embodiments, the gate dielectric layer 131 is formed by atomic layered deposition (ALD), molecular beam deposition (MBD), physical vapor deposition (PVD) or thermal oxidation. Next, a gate electrode layer 132 is formed on the gate dielectric layer 131, over the channel portions 108A of the fins 108 and fills the remaining recesses between the gate spacers 118B.

In some embodiments, the gate electrode layer 132 comprises a metal-containing material, such as Al, Cu, W, Co, Ti, Ta, Ru, TiN, TiAl, TiAlN, TaN, TaC, NiSi, CoSi or a combination thereof. Depending on whether the FinFET is a p-type FinFET or an n-type FinFET, the materials of the gate dielectric layer 131 and/or the gate electrode layer 132 are chosen. Optionally, a chemical mechanical polishing (CMP) process is performed to remove the excess portions of gate dielectric layer 131 and the gate electrode layer 132. The gate spacers 118B are located on sidewalls of the gate dielectric layer 131 and the gate electrode layer 132. That is, the stack strip structure 115 (including polysilicon strip 114, hard mask strip 116) is replaced and the replacement gate stack 130 is formed. In some embodiments described herein, the gate stack 130 is a replacement metal gate, but the structure(s) of the gate stack(s) or the fabrication processes thereof are not limited by these embodiments.

In some embodiments, the gate stack 130 is located on the insulators 110 and the source and drain regions are located on two opposite sides of the gate stack 130. The gate stack 130 covers the channel portions 108A of the fins 108, and the resultant FinFET includes a plurality of fins 108. In FIG. 4D, one gate stack 130 is shown, and the number of the gate stack 130 is for illustrative purposes but not intended to limit the structure of the present disclosure. In an embodiment, a plurality of gate stack 130 is provided, and the plurality of gate stack 130 is arranged in parallel.

In the above embodiments, as the flank portions 108B of the fins 108 are protruded out from the top surfaces of the insulators 110, and the flank portions 108B of the fins 108 are not recessed after removing the spacer material layer 118 and the oxide layer 112 thereon, the resultant epitaxy material portions 126 disposed onto the flank portions 108B of the fins 108 are formed with a narrow profile. That is, the epitaxy growth or epitaxy cladding of the epitaxy material portions 126 is stable but restrained from epitaxy overgrowth or epitaxy merge. The stably formed epitaxy material portions leads to better device performance as uniform stress is provided. The epitaxy material portions 126 disposed on different fins 108 are separate from each other, which is suitable for single fin transistor structure. Furthermore, the manufacturing method described in the above embodiments is suitable for fabricating the device with small fin pitch or spacing, as the angled ALE process leads to satisfactory removal of the spacer material from the fins. In addition, during the angled atomic layer etching process, no extra photoresist is used for covering the fins in certain regions and the shadowing effect is avoided. Accordingly, the resultant device can have better yield and less failure.

In some embodiments of the present disclosure, a fin-type field effect transistor comprising a substrate, at least one gate stack and epitaxy material portions is described. The substrate has fins and insulators located between the fins, and the fins comprise channel portions and flank portions beside the channel portions. The at least one gate stack is disposed over the substrate, disposed on the insulators and over the channel portions of the fins. The epitaxy material portions is disposed over the flank portions of the fins and at two opposite sides of the at least one gate stack, wherein the epitaxy material portions disposed on the flank portions of the fins are separate from one another.

In some embodiments of the present disclosure, a fin-type field effect transistor comprising a substrate, insulators, at least one gate stack and epitaxy material portions is described. The substrate has fins and trenches between the fins. The insulators are disposed within the trenches of the substrate. The at least one gate stack is disposed across and over channel portions of the fins and disposed on the insulators. The epitaxy material portions are disposed over flank portions of the fins and at two opposite sides of the at least one gate stack. The epitaxy material portions wrap around the flank portions of the fins and have narrow profiles, and the flank portions and the channel portions of the fins are protruded from the insulators and the flank portions and the channel portions of the fins have substantially a same height from top surfaces of the insulators.

In some embodiments of the present disclosure, a method for forming a fin-type field effect transistor is described. A substrate is provided and patterned to form trenches in the substrate and fins between the trenches. The fins comprise channel portions and flank portions. Insulators are formed in the trenches of the substrate. At least one stack strip structure is formed over the substrate and on the insulators. A spacer material is formed covering the at least one stack strip structure and covering the flank portions of the fins. Then, the spacer material layer on the flank portions of the fins is removed to expose the flank portions of the fins and gate spacers are formed on sidewalls of the at least one stack strip structure. Epitaxy material portions are formed on the flank portions of the fins and at two opposite sides of the at least one stack strip structure. After removing the at least one stack strip structure, a gate stack is formed between the gate spacers, on the insulators and covering the channel portions of the fins. The epitaxy material portions wrapping around the flank portions of the fins are located at two opposite sides of the gate spacers and the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin-type field effect transistor, comprising:
    a substrate having fins and insulators located between the fins, wherein the fins comprise channel portions and flank portions beside the channel portions;
    at least one gate stack, disposed over the substrate, the insulators and the channel portions of the fins, wherein the at least one gate stack comprises a gate dielectric layer;
    an oxide layer disposed on the channel portions, wherein the oxide layer is further sandwiched between the gate dielectric layer and the channel portions, and sandwiched between the gate dielectric layer and the insulators; and
    epitaxy material portions, disposed over the flank portions of the fins and at two opposite sides of the at least one gate stack, wherein the epitaxy material portions disposed at the two opposite sides of the at least one gate stack are separate from each other, wherein the epitaxy material portions are in contact with sidewalls of the flank portions without the oxide layer being located on the sidewalls of the flank portions.

2. The transistor of claim 1, wherein the channel portions and flank portions of the fins are protruded from the insulators.

3. The transistor of claim 1, wherein the flank portions of the fins and the channel portions of the fins have substantially a same height.

4. The transistor of claim 1, wherein the epitaxy material portions wrap around the flank portions of the fins.

5. The transistor of claim 1, wherein the epitaxy material portions conformally cover the flank portions of the fins.

6. The transistor of claim 1, wherein the at least one gate stack comprises:
    the gate dielectric layer, disposed on the insulators and covering the channel portions of the fins;
    a gate electrode layer, disposed on the gate dielectric layer; and
    gate spacers, disposed on sidewalls of the gate dielectric layer and the gate electrode layer,
    wherein the gate dielectric layer and the gate spacers are disposed on a top surface of the oxide layer, and the gate spacers and the insulators are spaced apart by the oxide layer.

7. The transistor of claim 1, wherein source and drain regions comprising the flank portions of the fins and the epitaxy material portions disposed on the flank portions are located at two opposite sides of the at least one gate stack.

8. A fin-type field effect transistor, comprising:
    a substrate having fins and trenches between the fins; insulators disposed within the trenches of the substrate;
    at least one gate stack, disposed across and over channel portions of the fins and disposed on the insulators, wherein the at least one gate stack comprises a gate dielectric layer;
    an oxide layer, disposed on the channel portions, wherein the oxide layer is further sandwiched between the gate dielectric layer and the channel portions, and sandwiched between the gate dielectric layer and the insulators; and
    epitaxy material portions, disposed over flank portions of the fins and at two opposite sides of the at least one gate stack, wherein the epitaxy material portions wrap around the flank portions of the fins and have narrow profiles, the epitaxy material portions are in contact with sidewalls of the flank portions, and the flank portions and the channel portions of the fins are protruded from the insulators, and the flank portions and the channel portions of the fins have substantially a same height from top surfaces of the insulators.

9. The transistor of claim 8, wherein the epitaxy material portions having narrow profiles conformally covers the flank portions of the fins.

10. The transistor of claim 8, wherein the at least one gate stack comprises a replacement metal gate.

11. The transistor of claim 8, wherein the at least one gate stack comprises:
    the gate dielectric layer, disposed on the insulators and covering the channel portions of the fins;
    a gate electrode layer, disposed on the gate dielectric layer; and
    gate spacers, disposed on sidewalls of the gate dielectric layer and the gate electrode layer,
    wherein the gate dielectric layer and the gate spacers are disposed on a top surface of the oxide layer, and the gate spacers and the insulators are spaced apart by the oxide layer.

12. The transistor of claim 11, wherein a material of the gate spacers comprises silicon nitride, silicon carbon oxynitride (SiCON), silicon carbonitride (SiCN) or combinations thereof.

13. A fin-type field effect transistor, comprising:
    a substrate having fins and insulators located between the fins, wherein the insulators are in contact with sidewalls of the fins and the fins comprise channel portions and flank portions beside the channel portions;
    at least one gate stack, disposed over the substrate, the insulators and the channel portions of the fins, wherein the at least one gate stack comprises a gate dielectric layer;
    an oxide layer, disposed on the channel portions, wherein the oxide layer is located directly on the insulators that are in contact with the sidewalls of the fins, and the oxide layer is further sandwiched between the gate dielectric layer and the channel portions, and sandwiched between the gate dielectric layer and the insulators; and
    epitaxy material portions, disposed over the flank portions of the fins and at two opposite sides of the at least one gate stack, wherein the epitaxy material portions disposed at the two opposite sides of the at least one gate stack are separate from each other, and the epitaxy material portions comprise over-layers of random orientations.

14. The transistor of claim 13, wherein the epitaxy material portions conformally covers the flank portions of the fins.

15. The transistor of claim 13, wherein the channel portions and flank portions of the fins protruded from the insulators have substantially a same height from top surfaces of the insulators.

16. The transistor of claim 13, wherein the at least one gate stack comprises:
   the gate dielectric layer, disposed on the insulators and covering the channel portions of the fins;
   a gate electrode layer, disposed on the gate dielectric layer and over the channel portions of the fins; and
   gate spacers, disposed on opposite vertical sidewalls of the gate dielectric layer and the gate electrode layer and disposed above the insulators.

17. The transistor of claim 16, wherein the gate dielectric layer and the gate spacers are disposed on a top surface of the oxide layer, and the gate spacers and the insulators are spaced apart by the oxide layer.

18. The transistor of claim 16, wherein a material of the gate spacers comprises silicon nitride, silicon carbon oxynitride (SiCON), silicon carbonitride (SiCN) or combinations thereof.

19. The transistor of claim 13, wherein source and drain regions comprising the flank portions of the fins and the epitaxy material portions disposed on the flank portions are located at two opposite sides of the at least one gate stack.

* * * * *